United States Patent [19]
Gabara

[11] Patent Number: 5,872,384
[45] Date of Patent: Feb. 16, 1999

[54] COMPONENT ARRANGEMENT HAVING MAGNETIC FIELD CONTROLLED TRANSISTOR

[75] Inventor: Thaddeus John Gabara, Murray Hill, N.J.

[73] Assignee: Lucent Technologies Inc., Murray Hill, N.J.

[21] Appl. No.: 785,516

[22] Filed: Jan. 17, 1997

[51] Int. Cl.$^6$ .................................................. H01L 29/82
[52] U.S. Cl. ......................................... 257/421; 257/427
[58] Field of Search ................................... 257/423, 426, 257/427

[56] References Cited

U.S. PATENT DOCUMENTS

| | | | |
|---|---|---|---|
| 4,654,684 | 3/1987 | Vinal | 357/27 |
| 4,801,883 | 1/1989 | Muller et al. | 324/252 |
| 5,021,758 | 6/1991 | Lane | 333/245 |
| 5,179,429 | 1/1993 | Ristic | 257/414 |
| 5,208,477 | 5/1993 | Kub | 257/421 |

FOREIGN PATENT DOCUMENTS

| | | | |
|---|---|---|---|
| 0063209 A1 | 2/1982 | European Pat. Off. | H01L 29/82 |
| 61-188978 | 8/1986 | Japan | H01L 43/06 |
| 08088324 | 4/1996 | Japan | H01L 27/04 |
| 2211987 | 10/1987 | United Kingdom | H01L 27/04 |

OTHER PUBLICATIONS

Nathan et al Two–Dimensional Numerical Modeling of Magnetic Field Sensors in CMOS Technology IEEE Trans Elec Dev ED–32, 1212, 1985.
N. Weste et al. *Principles of CMOS VLSI Design*, ch. 1, pp. 4–29 (Addison–Wesley Publishing Co. 1985).
P. Gray, et al. *Analysis and Design of Analog Integrated Circuits*, pp. 590–593 (John Wiley & Sons 1984).
S.M. Sze, VLSI Technology, ch. 11, pp. 466–515 (McGraw–Hill 1988).

N. Nguyen et al. "Si IC–Compatible Inductors and LC Passive Filters",*IEEE J. Solid–State Circuits*, vol. 25, No. 4, pp. 1028–1031 (Aug. 1990).
J. Chang, et al. "Large Suspended Inductors on Silicon and Their Use in a 2–$\mu$m CMOS Amplifier", *IEEE Electron Device Letters*, vol. 15, No. 5, pp. 246–248 (May 1993).
T. Gabara, et al. "A 27mW CMOS RF Oscillator Operating at 1.2 Ghz", Proc. of 1994 *IEEE Multi–Chip Module Conf. MCMC*–1994, pp. 15–19, (1994).
A. Grove, *Physics and Technology of Semiconductor Devices*, ch. 11, pp. 317–333 (John Wiley & Sons, 1967).
S. Sze, *Physics of Semiconductor Devices*, pp. 27–35 (John Wiley & Sons 1981).
T.J. Gabara, "Ground Bounce Control in CMOS Integrated Circuits", Digest of Technical Papers–*IEEE International Solid–State Circuits* Conference, pp. 88–89 (1988).

(List continued on next page.)

*Primary Examiner*—Olik Chaudhuri
*Assistant Examiner*—Douglas A. Willie
*Attorney, Agent, or Firm*—Robert E. Rudnick; John M. Harman

[57] ABSTRACT

A controllable magnetic field generator applies a magnetic field to a transistor device at a particular orientation for producing a corresponding Lorentz force on the flow of carriers in the device to advantageously deflect the carriers to facilitate performance of a corresponding desired circuit function. Such a component arrangement is useable in a variety of circuit configurations for performing different circuit functions with a reduced number of devices and complexity relative to conventional circuit configurations. Exemplary circuit configurations for signal mixers, differential amplifiers, switches, and multiplexers and demultiplexers are possible using as little as one or two devices. According to another aspect of the invention, an inductor coil is used for the magnetic field generator and is formed on a substrate containing the transistor device to provide a component arrangement having relatively compact dimensions.

12 Claims, 3 Drawing Sheets

OTHER PUBLICATIONS

H.P. Baltes, et al. "Integrated Semiconductor Magnetic Field Sensors", *Proceedings of the IEEE,* vol. 74, No. 8, pp. 1107–1132 (Aug. 1986).

C. Roumenin, "A Cross–Sensitivity Free 2–D Sensor For Magnetic Field", The 8th International Conf. on Solid State Sensors and Actuators and Eurosensors IX, Stockholm, Sweden, Jun. 1995.

M. Paranjape, et al. "A 2–D Vertical Hall Magnetic Field Sensor Using Active Carrier Confinement And Micromachining Techniques", The 8th International Conf. on Solid State Sensors and Actuators and Eurosensors IX, Stockholm Sweden Jun. 1995.

J. Lau, et al. "Minimum Detectable Signals of Ingrated Magnetic Sensors in Bulk CMOS and SOI Technologies for Magnetic Read Heads", The 8th International Conf. on Solid State Sensors and Actuators and Eurosensors IX, Stockholm, Sweden Jun. 1995.

M. Paranjape et al. "A 3–D vertical Hall magnetic–field sensor in CMOS technology" *Sensors and Actuators* A. 34, pp. 9–13 (1992).

A. Nathan, et al. "Two–Dimensional Numerical Modeling of Magnetic–Field Sensors in CMOS Technology", IEEE Transactions on Electron Devices, vol. ED–32, No. 7, pp. 1212–1219 (1985).

P.L.C. Simon et al. "Autocalibration of Silicon Hall Devices", The 8th International Conf. on Solid State Sensors and Actuators, and Eurosensors IX, Stockholm, Sweden, pp. 237–240 (1995).

P. C. Arnett, H. S. Lee, C. C. Lin, "Two–Drain Fet Magnetic Field Sensor", IBM Technical Disclosure Bulletin, vol. 13, No. 12, p. 3633, May 1971.

5,872,384

COMPONENT ARRANGEMENT HAVING MAGNETIC FIELD CONTROLLED TRANSISTOR

FIELD OF THE INVENTION

The invention relates to semiconductor devices, and more specifically, to such devices employing magnetic fields to achieve desired functions.

BACKGROUND OF THE INVENTION

Modern electronic products including, for example, consumer electronics, computers, telecommunication equipment and automobile electronics use semiconductor devices, such as transistors, to perform a desired function. Exemplary functions performed by semiconductor devices in such products include electrical signals routing switches, multiplexer/demultiplexers, differential amplifiers, and signal mixers such as up and down signal converters for modulation or demodulation. Typical circuit configurations of at least four transistors, in integrated circuit form or otherwise, are used for producing a 1×2 signal routing switch circuit or multiplexer/demultiplexer, which is described in greater detail in, for example, N. Weste and K. Eshraghian, *Principles of CMOS VLSI Design*, ch. 1, pp. 4–29 (Addison-Wesley Publishing Co. 1985), and incorporated by reference herein. Also, typical circuit configurations of at least seven transistors are used for producing an up or down signal converter circuit, such as a conventional Gilbert cell, which is described in greater detail in, P. Gray and R. Meyer, *Analysis and Design of Analog Integrated Circuits*, pp. 590–593 (John Wiley & Sons 1984), and incorporated by reference herein.

Reduction in the size, complexity and cost of electronic components has been a general goal of the electronic industry. A limited reduction in the size of typical components has been achieved by reductions in the size of the fabricated devices and other circuit elements. However, the complexity and number of devices required to perform such circuit functions has not been reduced in conventional electronic components.

Accordingly, a circuit configuration to perform such functions with a reduced number of devices and complexity is desirable.

SUMMARY OF THE INVENTION

The invention advantageously uses a controllable magnetic field generator at a particular position relative to a transistor device such that when carriers flow within the device, such as when the device is enabled, a magnetic field produced by the generator extends through the carrier flow and produces a Lorentz force that deflects the carriers in a desired relative direction to provide a corresponding desired circuit function. Transistor devices useable in such a component arrangement include those types that operate based on a flow of carriers, such as, for example, field effect transistors (FETs) and bipolar junction transistors (BJTs). The component arrangement of this invention is useable in a variety of circuit configurations for performing different functions with a reduced number of devices and complexity relative to conventional circuits.

Exemplary circuit configurations for signal mixers, up and down converters, modulators/demodulators, differential amplifiers, switches, and multiplexers/demultiplexers are possible using as little as one or two devices according to the invention. For example, it is possible for a signal mixer arrangement to use a single FET device and magnetic field generator. When the device is enabled, carriers flow forming an inversion layer under the gate, between the source and drain regions. The magnetic field generator is positioned, for example, such that it generates a corresponding magnetic field extending in a direction substantially perpendicular to the direction of the carrier flow and substantially parallel to the inversion layer.

The magnetic field is then varied based on a first signal to be mixed having a frequency $f_1$. A second signal to be mixed having a frequency $f_2$ is applied to the device gate which varies the formation of the inversion layer according to such frequency stimulus. As a result, carrier flow in the inversion layer is modulated by both the Lorentz force produced by the varying magnetic field according to the first signal as well as by the second signal at the device gate to produce a mixed signal with at least frequencies $|f_1 \pm f_2|$ at the device drain.

Further, it is possible for the magnetic field generator to be positioned such that a generated magnetic field extends substantially perpendicular to a formed inversion layer of an FET device having multiple drains. A corresponding produced Lorentz force would deflect the carriers flowing in the inversion layer to a desired one of the multiple drains based on the magnitude of the magnetic field. Such an arrangement is advantageously useable for performing circuit functions of, for example, a signal routing switch, multiplexer/demultiplexer as well as a signal mixer.

According to another aspect of the invention, an inductor coil is used for the controllable magnetic field generator and is formed on a substrate containing the transistor device to provide a component arrangement having relatively compact dimensions.

Additional features and advantages of the invention will become more readily apparent from the following detailed description and accompanying drawings.

DETAILED DESCRIPTION

Figure 1:
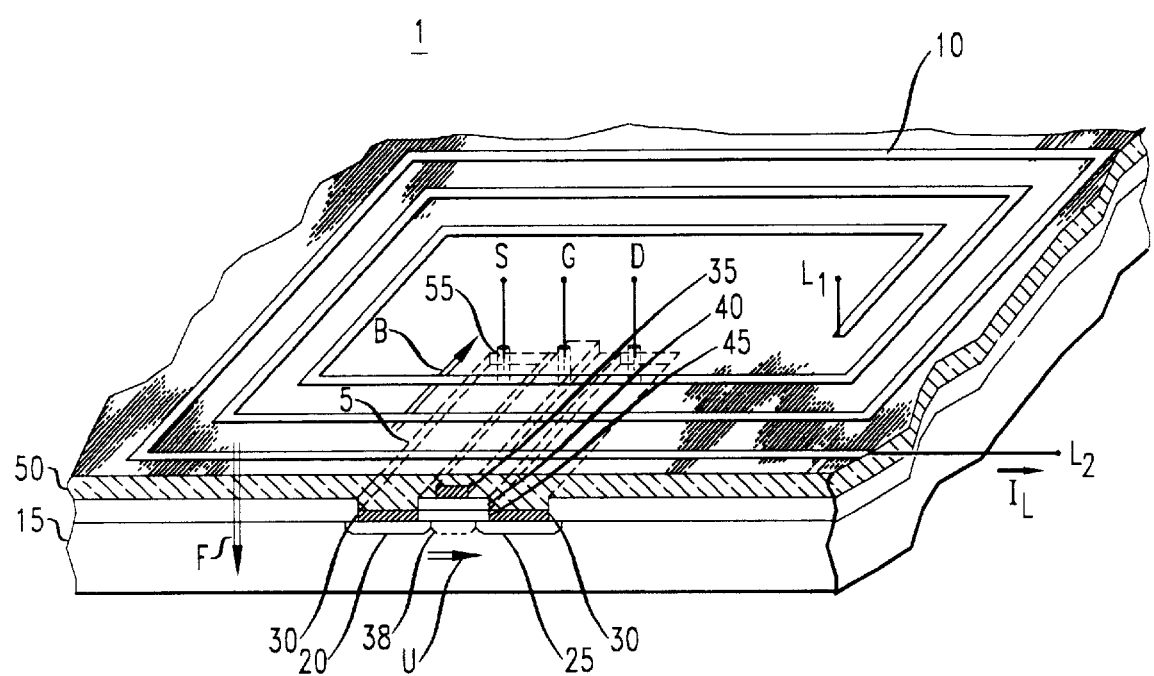
FIG. 1 is a cut-away perspective representation of a component arrangement in accordance with the invention.

The invention employs a controllable magnetic field generator at a particular relative position to a transistor device such that when the device is enabled and carriers flow within the device, a magnetic field produced by the generator extends through the carrier flow and produces a Lorentz force that deflects the carriers in a desired relative direction to cause the performance of a desired circuit function. Exemplary component arrangements for performing signal mixing and routing functions using field effect transistors (FETs) are depicted in the drawing and described below for illustration purposes only and not meant to be a limitation of the invention. Other transistor device-types operating based on a flow of carriers are also useable in a component arrangement according to the invention, including bipolar junction transistors (BJTs). Moreover, it should be readily understood that it is possible to practice the invention in numerous other component arrangements for performing other circuit functions including, for example, arrangements for performing circuit functions of a differential amplifier and multiplexer/demultiplexer.

An exemplary component arrangement 1 in accordance with the invention is shown in FIG. 1. Referring to FIG. 1, the component arrangement 1 includes a FET device 5 formed within a substrate 15, and a controllable magnetic field generator, such as inductor coil 10. It is possible for the device 5 to be a conventional ambient-temperature metal-oxide-semiconductor (MOS) FET or MOSFET. The particular type of MOS device used for the device 5 is not critical to practicing the invention and can be, for example, a NMOS, PMOS or CMOS device based on the desired operation of the component arrangement 1. Other types of FET devices useable for the device 5 include, for example, metal-semiconductor FET (MESFET) and metal-insulator-semiconductor-type. FET (MISFET) devices. Further, it is possible for the device 5 to be a discrete component or part of an integrated circuit. Conventional methods for fabricating the MOSFET device 5 are described in, for example, S. M. Sze, *VLSI Technology*, Chap. 11, pp. 466–515 (McGraw-Hill 1988), which is incorporated by reference herein.

Such conventional devices are typically formed of discrete layers of semiconductor, insulator and metal. For instance, the exemplary device 5 includes a p-type Si substrate 15 having source and drain regions 20 and 25 formed by doping with n-type impurities, such as arsenic or phosphorous for NMOS. An optional layer of silicide 30 is deposited over the source and drain regions 20 and 25 to reduce the source and drain resistance which enables greater current delivery by the device 5.

A gate 35 of the device 5 includes, for example, polysilicon 40 doped with an n-type impurity such as by an implant or vapor doping. The gate polysilicon 40 is disposed on a $SiO_2$ spacer 45 on the substrate 15. An optional layer of silicide (not shown) can also be deposited over the gate polysilicon 40 to reduce the gate's electrical resistance. An insulating layer 50 of, for example, $SiO_2$ or P-glass which is an oxide doped with a phosphorus is then deposited on the transistor to provide physical protection and to facilitate electrical connection. Contact windows 55 are etched in the insulating layer 50 to expose the device gate 35 and source and drain regions 20 and 25. Leads S, G and D are connected to the source, gate and drain regions 20, 35 and 25, respectively. Although a N-channel MOSFET device has previously been described, it should be readily understood that a P-channel device is also useable for the device 5.

The inductor coil 10 is formed on a surface of the insulator 50 and has leads $L_1$ and $L_2$. Conventional methods for forming such a coil include those described in N. Nguyen and R. Meyer, "Si IC-Compatible Inductors and LC Passive Filters", *IEEE J Solid-State Circuits*, vol. 25, no. 4, pp. 1028–31 (August 1990), and J. Chang, A. Abidi and M. Gaitan, "Large Suspended Inductors on Silicon and Their Use in a 2-μm CMOS RF Amplifier", *IEEE Electron Device Letters*, vol. 15, no. 5, pp. 246–248 (May 1993), which are both incorporated by reference herein. Although an on-chip inductor coil 10 is used for the controllable magnetic field generator, it is alternatively possible to use other structures, whether disposed on- or off-chip, for generation of a magnetic field in accordance with invention. For instance, a formed inductor coil supported at a distance above the substrate as described in, for example, T. Gabara, K. Tai, M. Lau, S. Pei, R. Frye and P. Sullivan, "A 27 mW CMOS RF Oscillator Operating at 1.2 GHz", *Proc. of 1994 IEEE Multi-Chip Module Conf MCMC*-1994, pp. 15–19 (1994), which is incorporated by reference herein, is useable and enhances the quality factor of the corresponding component arrangement. Other exemplary useable controllable magnetic field generator structures include electromagnets and current carrying conductors, such as a wire.

During operation, an inversion layer is formed in a channel under the gate 35 of the device 5, between the source and drain regions 20 and 25 under the gate 35. An exemplary formed inversion layer is shown between the layer 45 and the dashed line 38. It is possible to form such an inversion layer in a conventional manner such as by providing a sufficient voltage on the gate lead G and a voltage difference between the source and drain leads S and D. Carriers flow in the formed inversion layer from the source region 20 to the drain region 25. Carriers refer to flow of negative or positive charges or their equivalents in a semiconductor and include, for example, electrons to convey negative charges, such as in N-channel devices, or holes to convey positive charges, such as in P-channel FET devices. Carrier flow in transistor devices is described in general in A. Grove, *Physics and Technology of Semiconductor Devices*, ch. 11, pp. 317–333 (John Wiley & Sons, 1967), which is incorporated by reference herein. The velocity of the carriers flowing between the source 20 and the drain 25 is represented by the vector $\overline{U}$.

The carrier flow produces a corresponding signal output at the source and/or drain leads S and D. The formation of the inversion layer which controls the carrier flow rate and corresponding output signal magnitude is typically based on a voltage magnitude present at the gate 35. Accordingly, it is possible to modulate the carrier flow by modulating the voltage on the gate lead G. However, in accordance with the invention, it is also possible to further modulate the carriers reaching the drain 25 based on a magnetic field generated by the inductor coil 10. The magnitude of such a magnetic field is based on a current $I_L$ flowing in the inductor coil 10.

The inductor coil 10 is positioned such that a generated magnetic field extends under the coil 10 through the produced inversion layer in a direction substantially parallel to the inversion layer and substantially perpendicular to the direction of the carrier flow $\overline{U}$ as indicated by the magnetic flux density vector $\overline{B}$. Such a magnetic field produces a corresponding Lorentz force on the carriers in the direction indicated by the vector $\overline{F}$. The direction and magnitude of the force $\overline{F}$ acting on the carriers is based on the expression: $\overline{F}=q(\overline{E}+\overline{U}\times\overline{B})$, where the value q is the charge of the carriers and the vector $\overline{E}$ is the electric field in the MOS device caused by a Hall voltage produced in the device due to the effect of the magnetic field. Hall effect and the corresponding Hall voltage are described in, for example, S. Sze, *Physics of Semiconductor Devices*, pp. 27–35 (John Wiley & Sons 1981), which is incorporated by reference herein. Since the carriers are election in the N-channel device 5, the charge q has a negative value.

The carriers are deflected in the direction of the produced Lorentz force $\overline{F}$ which creates a Hall voltage that varies the threshold voltage and thereby, alters the number of carriers reaching the drain region 25. As a result, the signal produced at the drain lead D is altered a respective amount compared to a conventional device that is not exposed to such magnetic field. As a result, the magnitude of the magnetic field determines the extent of the variation of the number of carriers reaching the drain region 25. The invention exploits such behavior and modulates the carrier flow reaching the drain region 25 by controlling the current signal $I_L$ flowing in the inductor coil 10.

Such modulation operates substantially independent of the conventional modulation of the inversion layer depth and carrier flow rate by the voltage at the gate 35. As a consequence, the component arrangement 1 is advantageously useable for performing numerous signal mixing circuit functions, such as a modulator/ demodulator, up- or down-signal converter, and differential amplifier. An exemplary signal mixer circuit 100 using the component arrangement 1 is shown in FIG. 2, described below.

The particular length L of the gate 35 or channel length in the FET device 5 also determines the distance over which flowing carriers would be subjected to the magnetic field. As a consequence, longer gate lengths enable a greater deflection of the carriers from a particular magnetic field. Gate lengths L in the approximate range of, for example, 0.25 $\mu$m to 4.0 $\mu$m, are useable according to the invention. Also, the width W of the gate 35 should be large enough for providing sufficient exposure of the carrier flow to a generated magnetic field to achieve the desired modulation effect. For instance, when an on-chip inductor coil is used for the magnetic field generator, such as that shown in FIG. 1, it is possible to employ a gate width W in the range of approximately 20 $\mu$m to 80 $\mu$m based on the size of conventional fabricated on-chip inductor coils. However, if the magnetic field generator can produce magnetic fields of greater magnitudes, then smaller gate widths are useable.

Figure 2:
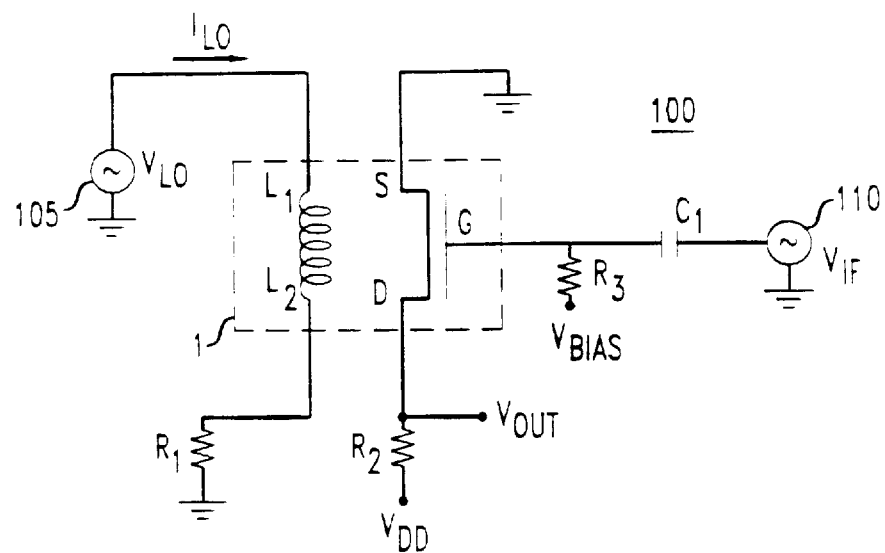
FIG. 2 illustrates a schematic block diagram of an exemplary signal mixer circuit employing component arrangement of FIG. 1.

In FIG. 2, the component arrangement 1 of FIG. 1 is shown by the schematic symbol indicated by like reference number 1 within the signal mixer circuit 100 for clarity. A local oscillator signal source, such as a voltage source 105, is connected to lead $L_1$ of the inductor coil in the component arrangement 1. The lead $L_2$ of the component arrangement 1 is connected to resistor $R_1$ that is connected to ground.

The device source lead S of the component arrangement 1 is also connected to ground. The device drain lead D of the component arrangement 1 is connected to resistor $R_2$ which is further connected voltage source $V_{DD}$. Also, an output signal $V_{OUT}$ is generated at the device drain lead D. The device gate lead G of the component arrangement 1 is connected to resistor $R_3$ which is further connected to a bias voltage source $V_{BIAS}$. A DC-blocking capacitor $C_1$ is connected between the device gate lead G and an intermediate frequency signal source, such as voltage source I 10.

In operation, the voltage source $V_{DD}$ and bias voltage source $V_{BIAS}$ generates sufficient voltages to produce an inversion layer in the FET device of the component arrangement 1 and cause carriers to flow between the device source and drain in a manner previously described with respect to FIG. 1. It is possible for the voltage of the voltage sources $V_{DD}$ and $V_{BIAS}$ to be in the approximate ranges of 1.8 V to 3.6 V, and 1.0 V to 2.0 V, respectively, when a conventional MOSFET device is employed in the component arrangement 1. The voltage source 110 generates signal $V_{IF}$ with a frequency $f_1$. The generated signal $V_{IF}$ produces a corresponding variation in the formation of the inversion layer at the frequency $f_1$ which causes a corresponding modulation of the carrier flow rate at that frequency. Such modulation of the carrier flow rate produces a corresponding oscillating signal variation in the output signal $V_{OUT}$ at the frequency $f_1$.

The voltage source 105 generates a signal $V_{LO}$ having a frequency $f_2$. A corresponding produced current $I_{LO}$ through the inductor coil of the component arrangement 1 causes a corresponding magnetic field that varies in magnitude at the frequency $f_1$. Such variation in magnitude produces a corresponding variation of the Lorentz force upon the carriers in the device of the component arrangement 1 and correspondingly modulates the carriers reaching the device drain. As, a result, the output signal $V_{OUT}$ is also modulated at the frequency $f_2$ independent of the modulation at the frequency $f_1$ due to the corresponding variation of the intermediate frequency signal $V_{IF}$ at the device gate lead G. As a consequence, the generated output signal $V_{OUT}$ possesses at least three frequency components of $f_1$ and $f_2$ as well as $f_2+f_1$ and $f_2-f_1$. Typically, the output signal $V_{OUT}$ would also include frequency components based on the harmonics of the intermediate frequency $f_1$, such as $f_2+2f_1$ and $f_2-2f_1$, and $f_2+3f_1$ and $f_2-3f_1$, etc., which can be removed by filtering in a conventional manner, if desired.

Figure 3:
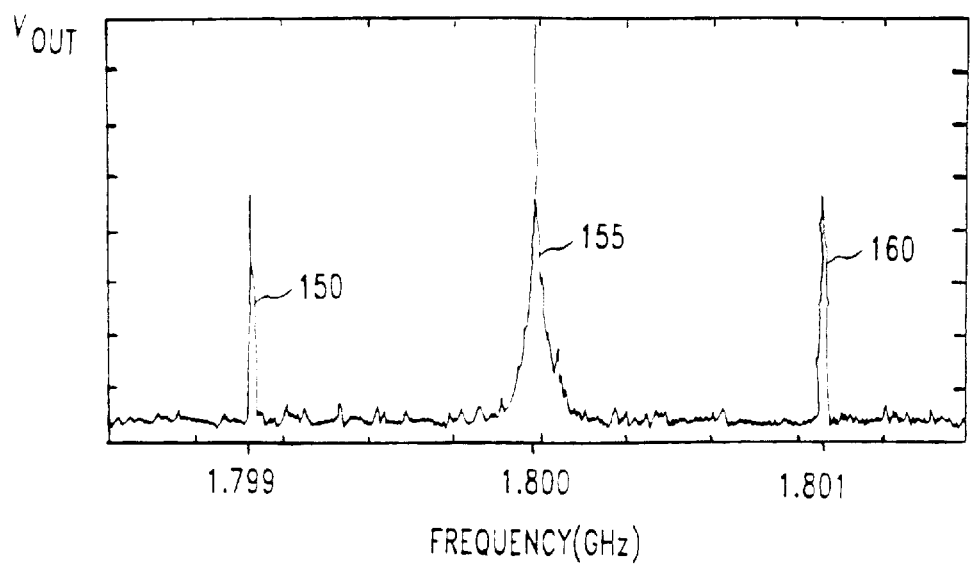
FIG. 3 illustrates a graph of an exemplary modulated signal produced by the signal mixer circuit shown in FIG. 2.

FIG. 3 depicts an exemplary output signal $V_{OUT}$ of the circuit 100 as represented on a spectrum analyzer. The local oscillator and intermediate frequencies $f_2$ and $f_1$ employed to generate the output signal $V_{OUT}$ in FIG. 3 are 1.8 GHz and 1.0 MHz, respectively. Accordingly, spectral peaks occur at frequencies 1.799 GHz, 1.800 GHz and 1.801 GHz as indicated by reference numbers 150, 155 and 160. The particular signal frequencies being mixed by the component arrangement 1 is not critical to practicing the invention. Exemplary frequencies that can be provided to an inductor coil when used as the magnetic field generator can be less than 1 Hz or to a maximum that is limited by the resonance frequency of the inductor coil, which is typically on the range of 2 GHz to 7 GHz for conventional fabricated on-chip inductors. Moreover, the frequency of the signal applied to the gate lead G can be in the range from less than 1 Hz to as large as 2 to 3 GHz in conventional MOSFET devices. However, DC coupling may be required to achieve such frequency range.

The exemplary circuit 100 of FIG. 2 illustrates an up-conversion signal mixing operation for illustrations purposes only and it should be readily understood that a corresponding down-conversion circuit can be produced in a substantially similar manner in accordance with invention. Moreover, FIG. 1 depicts a single device 5 interacting with the magnetic field generator 10 for illustration purpose only, and in particular signal mixing operations including, for example, mixing of multiple signals and/or for providing greater signal strength or balanced output signals, it is possible to configure a component arrangement such that a plurality of devices are positioned within the magnetic field produced by the generator 10.

Figure 4:
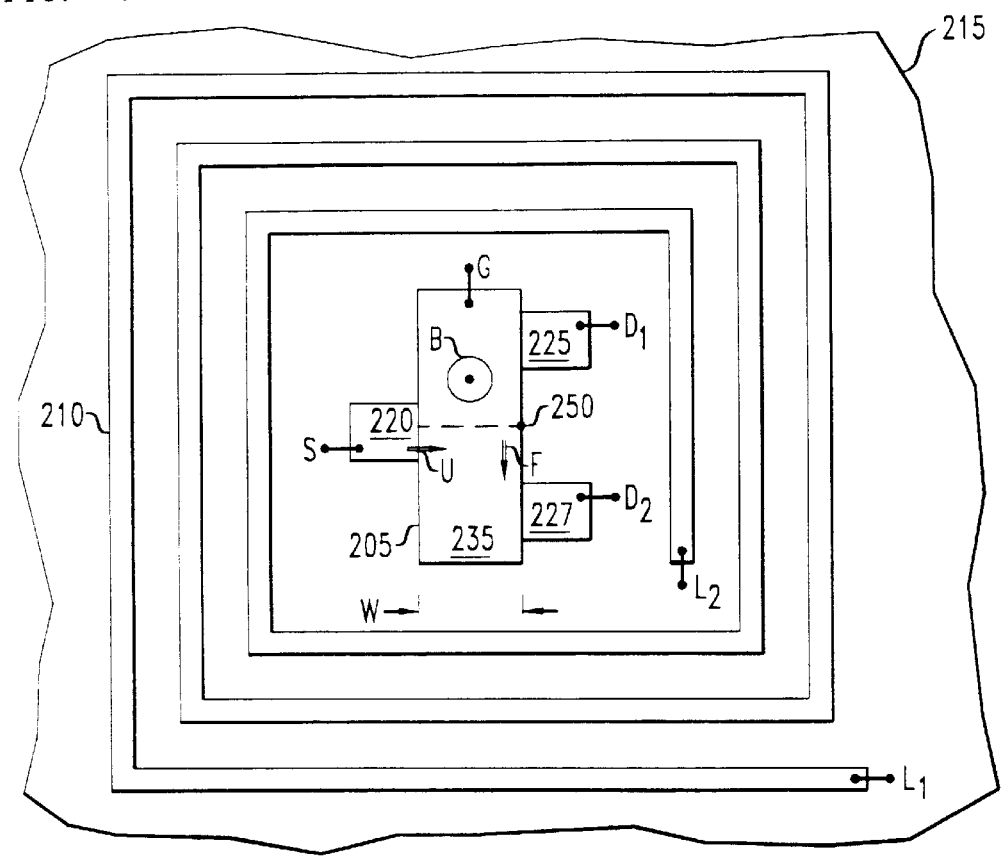
FIG. 4 is a top view of a second exemplary component arrangement in accordance with invention.

Although FIG. 1 depicts a component arrangement 1 producing a magnetic field $\overline{B}$ extending parallel to the inversion layer and perpendicular to the flow of carriers $\overline{U}$, it should be readily understood that deviation from such orientation still provides the advantageous signal mixing according to the invention, but with corresponding attenuated frequency components in the output signal caused by such an oriented magnetic field. Moreover, it is possible to position the magnetic field generator such that a generated magnetic field extends through a formed inversion layer in a substantially perpendicular orientation according to another embodiment of the invention. FIG. 4 illustrates an exemplary component arrangement 200 having such a perpendicular magnetic field orientation. Such an arrangement is useable for signal routing switch functions including, for example, multiplexing/demultiplexing, as well as signal mixing operations as is described below with respect to FIGS. 4 and 5.

In FIG. 4, the component arrangement 200 includes a magnetic field generator, such as inductor coil 210 formed on an insulator layer of a substrate 215 having a multiple-drain FET device 205 formed therein. It is possible to form the inductor coil 210 and device 205 in a substantially similar manner to that described above with respect to FIG. 1. It should be readily understood that if the insulator layer is opaque, the device 205 would not be visible from a top view as shown in FIG. 4. The device 205 has been illustrated in FIG. 4 to show an orientation of the inductor coil 210 relative to the device 205 for generating a desired magnetic field by the coil 210 that extends substantially perpendicular through a formed inversion layer in a channel of the device 205. In FIG. 4, such a perpendicular orientation extends into, or out of, the drawing page.

It is possible for the device 205 to be, for example, a P-channel MOSFET, and includes source and gate regions 220 and 235 as well as two drain regions 225 and 227. It is possible to form the two drain regions in a MOSFET device by respectively doping the desired drain regions as is typically in a conventional single drain FET device, and allowing opposite-doped Si tub to remain between the drain regions 225 and 227. Electrically conductive leads S, G and D1 and D2 connect to the respective device regions 220, 235, and 225 and 227, as is schematically represented in FIG. 4.

In operation, an inversion layer is formed beneath the gate region 235 of the device 205, such as in the manner previously described with respect to FIG. 1. Carriers flow in the inversion layer in the general direction represented by the vector $\overline{U}$. The rate at which carriers flow in the device 205 is dependent on the voltage on the gate lead G that controls the formation of the inversion layer.

The position of the inductor coil 210 relative to the device 205 enables generation of a magnetic field that extends in a substantially perpendicular direction relative to the formed inversion layer of the device 205. More specifically, a generated magnetic field would extend in a direction into, or out of, the drawing page based on the direction of current flow through the inductor coil 210. As a result, a corresponding Lorentz force is produced that deflects flowing carriers toward either the drain region 225 or the drain region 227.

In particular, when the current in the inductor coil 210 produces a magnetic filed that extends through the inversion layer in a direction out of the drawing page as indicate by the vector B, a corresponding Lorentz force is produced on the flowing carriers or holes in the direction indicated by the force vector $\overline{F}$. As a consequence, carriers flowing in the inversion layer under the gate 235 tend to be deflected away from the drain region 225 and toward the drain region 227. In a similar manner, when the current in the inductor coil 2 10 produces a magnetic field that extends through the inversion layer in a direction into the drawing page, a corresponding Lorentz force is produced that deflects carriers toward the drain region 225 and away from the drain region 227. Accordingly, the component arrangement 200 is useable as a 1×2 signal routing switch or multiplexer/demultiplexer because of its ability to direct a signal on the source lead S to a desired drain lead D1 or D2, based on the particular direction of the produced magnetic field.

In the exemplary component arrangement 200, longer gate lengths in the device 205 enable greater deflection of the carriers in the inversion layer because the Lorentz force has an opportunity to act on traveling carriers over a greater distance. Typically, if a conventional MOSFET is used for the device 205, then a deflection toward the respective drain regions 225 and 227 on the order of approximately 0.2 $\mu$m to 0.4 $\mu$m is achievable with a channel or gate length L of approximately 8 $\mu$m, when a magnetic flux density on the order of 0.05 W/m$^2$ is used. Longer lengths or greater magnetic field strength produces a corresponding greater deflection.

The separation of the drain regions 225 and 227 from a center position 250 corresponding to the position of the source region 220 can be based on the deflection and electrical isolation achievable with the particular gate width and field strength used in the component configuration according to the invention. For instance, if the previously recited gate width and magnetic flux density of 8 $\mu$m and 0.05 W/m $^2$, respectively, enable a deflection in the range of approximately 0.2 $\mu$m to 0.4 $\mu$m, then the drain regions 225 and 227 can be separated from the position 250 by a likewise 0.2 $\mu$m to 0.4 $\mu$m. The particular widths of the drain regions 225 and 227 is not critical to practicing the invention and can be based on suitable technology for bonding contact pads to such regions. Exemplary drain region widths for use with conventional contact pad bonding technology is in the range of 0.2 $\mu$m to 0.4 $\mu$m. Moreover, in such an exemplary arrangement, it is likewise advantageous to employ a source region 220 having a width of at least 0.4 $\mu$m for the same reason when using conventional contact pad bonding technology.

Although FIG. 4 depicts a component arrangement 200 producing a magnetic field $\overline{B}$ extending perpendicular to an inversion layer, it should be readily understood that deviation from such orientation will still provide the advantageous carrier deflection. Accordingly, such deviation of the magnetic field orientation is useable according to the invention, if it is able to produce a desired deflection of the carriers.

The device 205 of the component arrangement 200 is shown with two drains for illustration purposes only and is not meant to be a limitation on the invention. FET devices with a greater number of drains are also useable according to the invention. In such multiple drain arrangements, it is possible to generate a magnetic field having a particular magnitude and direction to deflect carriers a desired amount to produce a signal at a desired one of the drain regions. Moreover, FET devices having multiple sources are useable in accordance with this embodiment of the invention to likewise perform a switching ftuction including, for example an M×N signal routing switch where M and N are greater than two.

Figure 5:
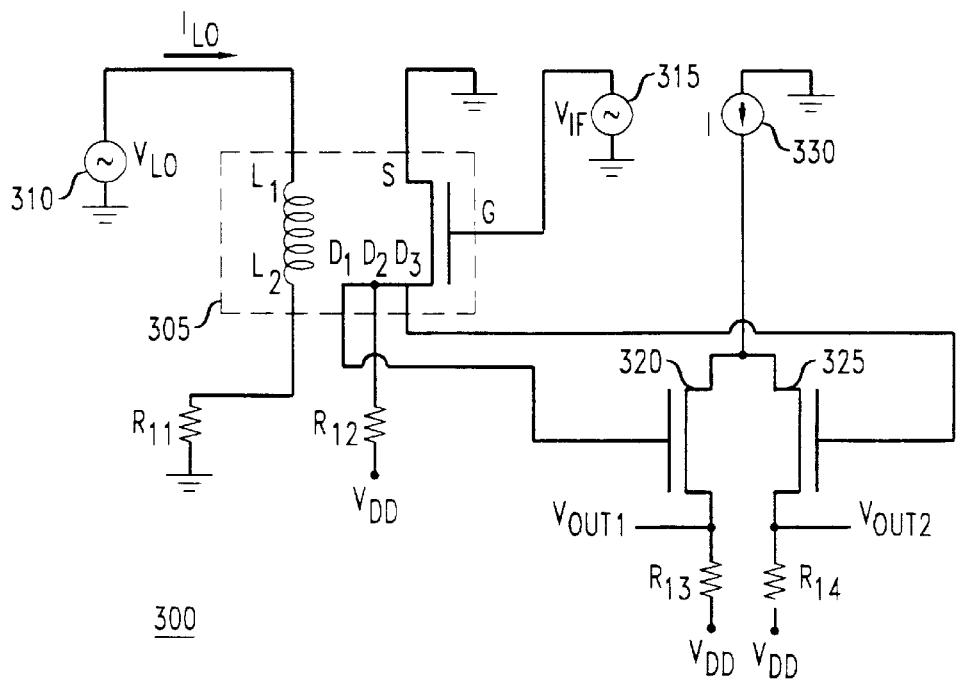
FIG. 5 illustrates a schematic block diagram of exemplary signal mixer circuit employing the component arrangement of FIG. 4.

An exemplary FET device with one source and three drains is useable in a component arrangement for providing a signal mixing operation in accordance with the invention. An exemplary signal mixing circuit 300 employing such a component arrangement for producing balanced output signals is shown in FIG. 5. A balanced output includes two output leads with the voltage at the first output lead having the same relative amplitude but opposite relative polarity of the voltage at the second output lead. Balanced output signals are typically used to negate inductive noise in those systems where inductive noise tends to be a problem. A general description of inductive noise is provided in T. J. Gabara, "Ground Bounce Control in CMOS Integrated Circuits", *Digest of Technical Papers-IEEE International Solid-State Circuits Conference*, pp. 88–89 (1988), which is incorporated by reference herein.

In FIG. 5, the component arrangement is schematically represented by the symbol 305. The component arrangement 305 includes an FET device coupled to source lead S, gate lead G and three drain leads D1, D2, and D3. The drain lead D2 is coupled to a center drain region of the FET device that is disposed across the gate region directly opposite a corresponding source region. For instance, it is possible to locate such a drain region at the position 250 in FIG. 4. In FIG. 5, respective drain regions coupled to leads D1 and D3 are disposed on either side of the center drain region. It is possible for the respective separation distances between the drain regions coupled to leads D1 and D3 and the center drain region to be, for example, in the range of approximately 0.4 μm to 90 μm for a typical MOSFET device.

The inductor coil in the component arrangement 305 is connected to a local oscillator signal source, such as voltage source 310, as well as resistor $R_{11}$ that is further connected to ground. Device source lead S of the component arrangement 305 is connected to ground. Device gate lead G of the component arrangement 305 is connected to an intermediate frequency source, such as voltage source 315 which is connected to ground. Drain lead D2 is connected to resistor $R_{12}$ which is connected to voltage source $V_{DD}$. Drain leads D1 and D3 are connected to gates of transistors 320 and 325, respectively. A current source 330 that provides a substantially constant current I is connected to sources of the transistors 320 and 325. Drains of the transistors 320 and 325 provide the respective balanced output signals $V_{OUT1}$ and $V_{OUT2}$. The drains of the transistors 320 and 325 are also connected to respective resistors $R_3$ and $R_{14}$ which are further connected to voltage source $V_{DD}$.

In operation, the voltage source 310 generates a signal $V_{LO}$ having a frequency $f_1$. A corresponding produced current $I_{LO}$ through the inductor coil of the component arrangement 305 generates a magnetic field varying in magnitude at the frequency $f_1$. Such magnetic field variation produces a corresponding variation in the Lorentz force deflecting carriers flowing from the source to the center drain region toward the drain regions coupled to leads D1 and D3 in an oscillating manner. As a result, the voltage on leads D1 and D3 likewise vary in an oscillating manner according to the frequency $f_1$, but at 180° out of phase from one another. Moreover, the gate voltage in the device of the component arrangement 305 is varied according to an intermediate frequency $f_2$ of a signal $V_{IF}$ produced by the source 315. Accordingly, the signals on the drains leads D1 and D3 are further modulated by the intermediate frequency $f_2$. Thus, the signals at the respective drain leads D1 and D3 each include frequency components of frequency $f_1$ and $f_2$ as well as at least frequencies $f_1+f_2$ and $f-f_2$ with the respective frequency components being substantially 180° out of phase with one another relative to the frequency $f_1$.

Since the drain leads D1 and D3 are connected to the respective gates of the transistors 320 and 325, the inversion layer in these respective devices varies according to such mixed and out of phase signals. As a consequence, the substantially constant current I provided by the source 330 flows through the respective transistors 320 and 325 as modulated by the signals at the respective transistor gates. As a consequence, the respective output signals $V_{OUT1}$ and $V_{OUT2}$ at the drains of transistors 320 and 325 likewise corresponds to the mixed signals with the frequency components $f_1$ being substantially 180° out of phase from one another. Also, since the current provided to the respective drains of transistors 320 and 325 is apportioned from the substantially constant current source 330, the relative electrical currents of the respective output signals $V_{OUT1}$ and $V_{OUT2}$ are regarded as balanced.

Although the signal mixer circuit configuration 300 produces a corresponding balanced output signal, it is possible to generate a single unbalanced output in a substantially similar manner according to the invention. In such a circuit, the transistors 320 and 325 as well as the current source 330 can be omitted, wherein the unbalanced mixed signal output is provided at either of the drain leads D1 or D3. In such an arrangement, it is possible to omit the drain lead D3 and its corresponding drain region while obtaining the single unbalanced mixed signal output at the drain lead D1.

Although several embodiments of the invention have been described in detail above, many modifications can be made without departing from the teaching thereof. All of such modifications are intended to be encompassed within the following claims. For example, although the previously described embodiments employ an inductor coil disposed on the same substrate as the device, it is possible to alternatively position the inductor coil on a separate substrate positioned in close proximity to the device to provide the desired magnetic field extending through the device. Also, the previously described embodiments advantageously employed an inductor coil as the controllable magnetic field generator of the invention due to its compact dimension and low cost of manufacturer. However, it is possible to use other types of controllable magnetic field generators instead of the inductor coil including, for example, a electro-magnet or a current carrying conductor, such a wire.

The invention claimed is:

1. A component arrangement comprising:
   a transistor device; and a controllable magnetic field generator, wherein the generator is at a fixed position relative to said device such that when carriers flow within an inversion layer formed within said device, a magnetic field produced by the generator extends through said carrier flow in a direction substantially parallel to said inversion layer and substantially perpendicular to the direction of said carrier flow and produces a Lorentz force on said carriers in said flow in a desired relative direction to perform a corresponding desired circuit function, said controllable magnetic field generator having a magnetic coil that lies substantially in a plane that is substantially parallel to said carrier flow.

2. The arrangement of claim 1 wherein said transistor device is a field effect transistor (FET) device.

3. The arrangement of claim 1 for performing a signal mixer function, wherein a magnitude of the generated magnetic field is controlled by a first signal to be mixed.

4. The arrangement of claim 3 having at least two drains for producing balanced output signals.

5. The arrangement of claim 1 wherein said device is a bipolar junction transistor.

6. The arrangement of claim 1 wherein said magnetic field generator is formed on said device.

7. The arrangement of claim 1 wherein said magnetic field generator is positioned in close proximity to said device.

8. The arrangement of claim 1 wherein a plurality of devices are positioned relative to said magnetic field generator to perform said desired circuit function.

9. The arrangement of claim 1 wherein said magnetic field generator is an inductor.

10. A component arrangement for mixing first and second signals comprising:
    a field effect transistor device having a source, gate and at least one drain, said gate for receiving said first signal; and
    a controllable magnetic field generator, said generator for generating a magnetic field that varies in accordance with said second signal, wherein the generator is at a fixed position relative to said device such that when an inversion layer is formed within said device and carriers flow within said inversion layer at a rate varying in accordance with said first signal, said generated magnetic field extends through said carrier flow and produces a Lorentz force to deflect said carriers in a desired relative direction in accordance with said second signal to perform said mixing function, said controllable magnetic field generator having a magnetic coil that lies substantially in a plane that is substantially parallel to said carrier flow, wherein said position of the generator generates said magnetic field that extends in a direction substantially parallel to said inversion layer and substantially perpendicular to a direction of said carrier flow.

11. The arrangement of claim 10 wherein said magnetic field generator is formed on said device.

12. The arrangement of claim 11 wherein said magnetic field generator is an inductor.

* * * * *